United States Patent [19]
Sikkink et al.

[11] Patent Number: 5,329,188

[45] Date of Patent: Jul. 12, 1994

[54] CLOCK PULSE MEASURING AND DESKEWING SYSTEM AND PROCESS

[75] Inventors: Mark R. Sikkink, Chippewa Falls; Kenneth A. Van Goor, Fall Creek; Gregory R. Edlund, Eau Claire; Arthur H. Orth, River Falls, all of Wis.

[73] Assignee: Cray Research, Inc., Eagan, Minn.

[21] Appl. No.: 803,926

[22] Filed: Dec. 9, 1991

[51] Int. Cl.⁵ ........................ H03K 5/19; G01R 19/12
[52] U.S. Cl. ................................. 307/517; 307/523; 307/262; 328/109; 328/140; 328/155
[58] Field of Search ............... 307/517, 523, 518, 603, 307/262, 269; 328/109, 140, 141, 155, 63, 72; 377/118, 124, 126, 122

[56] References Cited

U.S. PATENT DOCUMENTS

| | | | |
|---|---|---|---|
| 4,514,749 | 4/1985 | Shoji | 357/68 |
| 4,637,018 | 1/1987 | Flora et al. | 328/55 |
| 4,696,019 | 9/1987 | Tulpule et al. | 375/107 |
| 4,755,704 | 7/1988 | Flora et al. | 307/209 |
| 4,805,195 | 2/1989 | Keegan | 375/106 |
| 4,833,695 | 5/1989 | Greub | 375/118 |
| 4,845,390 | 7/1989 | Chan | 328/55 |
| 4,860,322 | 8/1989 | Lloyd | 375/107 |
| 4,926,066 | 5/1990 | Maini et al. | 307/303.1 |
| 4,959,540 | 9/1990 | Fan et al. | 250/227.12 |
| 5,087,829 | 2/1992 | Ishibashi et al. | 328/55 |

*Primary Examiner*—Timothy P. Callahan
*Attorney, Agent, or Firm*—Daniel J. Kluth

[57] ABSTRACT

The skew of a circuit within a clock pulse distributing network is determined by establishing a closed loop circuit including the circuit under test. A sampling period is established such as by a counter actuated by the clock pulses. During that sampling period, the number of pulses recurring within the closed loop circuit are counted in yet another counter. The count is then useful not only to indicate the magnitude of the circuit skew but also allows optimization of the delay introduced to the circuit under test during normal operation. The skew is thus determined dynamically under typical machine environment situations.

23 Claims, 4 Drawing Sheets

CLOCK PULSE MEASURING AND DESKEWING SYSTEM AND PROCESS

BACKGROUND OF THE INVENTION

1. Field of the Invention

The present invention relates to apparatus and methods for determining the amount of skew between master clock pulses in system environments wherein reliable system operation demands arrival of such clock pulses at a plurality of locations within a predetermined minimum displacement from each other. More particularly, the present invention relates to systems and methods for dynamically identifying the amount of clock pulse skew associated with circuit elements in their operating environment. The present invention is especially useful in high speed computer systems using a multiplicity of processors and interconnected units.

2. Description of the Prior Art

In the multiple processor computer systems environment, clock pulses from a common source are distributed for controlling many widely separated circuit modules. The time delay associated with passage of a signal in the form of an electrical and/or optical pulse through many discrete components and paths are not uniform so that they arrive in skewed time relation to each other. Typically the master clock pulses from a common source are distributed after a multiplicity of switching functions, amplifications, replications, or other signal handling operations so as to allow further distribution of those pulses throughout a complex system in a carefully controlled manner.

System efficiency demands distribution of the timing pulses originating from the master clock pulse source with minimal skew for controlling a variety of electronic data handling and/or computer functions. The clock pulses must arrive at a plurality of distribution points within an extremely close time tolerance and with well preserved signal integrity as compared to the original master clock pulses.

It is possible to minimize a limited amount of clock pulse skew by applying careful attention to the layout and design of the circuit topography. Examples are shown in U.S. Pat. Nos. 4,514,749 by Skoji and 4,926,066 by Maimi et al. These steps are only effective for the chips themselves and cannot address skew from various divergent clock pulse path interconnections. In addition, such skew compensations, once implemented, cannot accommodate introduction of subsequent increments of skew as from component aging, operating environment variations, and so forth.

Optical signal handling components tend to introduce little skew. Thus others have suggested minimizing skew by liberal usage of optical path elements as in copending and commonly assigned U.S. patent application Ser. No. 07/536,270 as well as in U.S. Pat. No. 4,959,540 by Fan et al.

A variety of electronically oriented configurations for minimizing skew are also known. U.S. Pat. No. 4,860,322 by Lloyd employs cross coupling of clock pulses between sets of distribution tree elements which is impractical and unwieldy for large systems. U.S. Pat. No. 4,696,019 by Tulpule et al synchronizes clock pulses between multiple processors by coupling them in a master/slave configuration with majority voting to select the controlling clock pulses.

Measurement of skew dynamically between circuit elements is possible by implanting probes within the hardware. Theoretically it is possible to sense these direct measurements and take steps to adjust the skew periodically or during system operation. However, in high speed, multiprocessor environments, physical complexity renders this option unacceptable.

One solution is described in the above mentioned copending and commonly assigned U.S. patent application Ser. No. 07/536,270 entitled CLOCK DISTRIBUTION APPARATUS AND PROCESSES PARTICULARLY USEFUL IN MULTIPROCESSOR SYSTEMS by Priest et al wherein the total delays of all relevant clock paths is determined. Various delay segments are thereafter incorporated into each path so that the total delay is the same or at least within tolerance for all paths. That is, once the amount of delay needed for each individual clock path is determined to establish a common delay throughout all clock paths, appropriate delay elements are incorporated in each path such as by introducing settings to selectable delay elements. This procedure is effective but cannot accommodate variations in the system components due to differing environments, aging, and the like.

A variety of configurations of selectable delay elements for incorporation in-line with each path have been around for some time including arrangements using both coarse delay elements and fine delay elements. Banks of such parallel elements with the banks coupled in series are shown in U.S. Pat. No. 4,805,195 by Keegan. A dynamic phase comparison to select the appropriate clock pulse delay by means of a multiplexer is described in U.S. Pat. No. 4,755,704 by Flora et al. Finally U.S. Pat. No. 4,833,695 by Greub delays clock pulses in response to an undisclosed external data source with phase comparator circuits coupled to monitor and stabilize operation of the delay circuit elements.

The various prior art devices and systems either are unacceptable for multiple processor environments or significantly increase the cost of such systems while reducing the reliability thereof. None of the known prior art systems are capable of dynamically determining the actual delay associated with the distribution paths of the clock pulses so as to permit regular adjustment of the clock skew with minimal additional circuit elements added to the already complex system configuration.

DISCLOSURE OF THE INVENTION

In accordance with this invention, a closed loop is established once an output of an integrated circuit (IC) or the like is selected by a controlling processor or master control unit (MCU). This loop contains a variable delay element controllable by the MCU. A counting time window is determined and the number of pulses occurring through ringing oscillation in the closed lopp circuit is sensed by a counter. The MCU can interpret the count thus accumulated as a measure of skew for the IC under test.

The MCU can adjust the amount of delay in the loop under test until a count is obtained within a predetermined range of maximum and minimum counts correlated to acceptable skew variations as compared to skews present in other circuit elements. The delay that produces the optimum results is obtainable by successive approximations and, once determined, is stored for future use by the MCU. Typically the test method of this invention is employed during quiescent periods of the host processor system such as during maintenance or other down time intervals.

In one embodiment, the system clock sets a frequency counter which counts off a reference time window. A second counter is started and stopped under control of the window defining counter to accumulate pulse counts associated with the closed loop. The final content of the second counter is then a measure of frequency and/or delay of the clock chip as is determinable by the MCU.

Varying the delay in the closed loop with a fixed counting window is preferable to optimize the skew between elements. However, it is possible to maintain the feedback constant and vary the counting window length if all that is needed is a relative measure of the magnitude of the skew.

Apparatus in accordance with this invention is configured for determining the delay of a circuit intended for delivering clock pulses from a source to a clock pulse utilizing circuit. A selectively operable arrangement is employed for establishing a closed loop circuit including the clock pulse delivering circuit. A measure of the clock pulse delivering circuit delay is then obtained by determining the length of time for ringing pulses to recirculate through the closed loop circuit.

A sampling period of time is established for determining the ringing pulse duration. The recurring pulses within the closed loop are counted for the duration of the aforesaid sampling period of time. One way of establishing the sampling period is to utilize a counter for counting a predetermined number of system clock pulses. The closed loop pulse counting is thus enabled to count closed loop pulses for a time period corresponding to the time required for a predetermined number of system clock pulses to occur.

A selectable amount of delay is incorporated into the clock pulse delivering circuit during each sampling period. This delay is variable and samples over a range of delays makes it possible to determine the closed loop counts and thus the optimum delay to select for incorporation into the clock pulse delivering circuit for normal operation.

The present invention is directed to the methods and apparatus for periodically adjusting the amount of delay applied to system clock pulses by a pulse transferring circuit connecting the clock pulses to utilization circuitry. A variable delay is responsive to digital data for producing an output pulse subsequent to receipt of an input pulse with the delay therebetween corresponding to the aforementioned digital data. The variable delay is coupled between the source of the system clock pulses and a plurality of the pulse transferring circuits. The variable delay is selectively decoupled from the source of clock pulses and a closed loop ringing circuit is established including the variable delay and at least one of the pulse transferring circuits. The number of pulses that occur in this closed loop ringing circuit is determined over a predetermined sampling time period.

Upon re-coupling the system clock pulse source for normal operation, the value of digital data controlling the variable delay is set in accordance with the number of pulses counted. Each structural arrangement for interconnecting the clock pulses from the source to the utilization devices can be considered a network. Thus there are a plurality of such networks with each including a connection to the common source at one end and to respective clock pulse utilization devices at the other end. Each network further includes a pulse transferring circuit, a selectively variable delay, a coupling means, and an arrangement for establishing a closed loop. A computer can control the networks both to determine the amount of delay each network is experiencing as well as to select appropriate delay levels for normal operation.

The method of this invention for determining the delay of a circuit for delivering clock pulses from a source to a clock pulse utilizing circuit starts with the step of establishing a closed loop circuit including the clock pulse delivering circuit. Thereafter the length of time for ringing pulses to recirculate through the closed loop circuit is determined. This length of time correlates to the delay of the clock pulse delivering circuit.

The determination of the length of time of closed loop pulse ringing is preceded by selecting a sampling period of time as a standard. The recurrence of pulses within the closed loop are counted for the duration of the sampling period of time thus established. One way of establishing the sampling period is to count a predetermined number of system clock pulses followed by performing the closed loop pulse counting to count closed loop pulses for a time period corresponding to the time required for a predetermined number of system clock pulses to occur.

Thereafter it becomes possible to introduce a selectable amount of delay in the clock pulse delivering circuit while selecting the amount of that delay in response to the closed loop count. That is, the optimum delay for minimizing skew between all the clock pulse transferring circuits is determinable from the series of closed loop counts. The value of that delay is stored and employed to select the operational delay thereafter. Further, it is possible to determine the average delay of all the lock pulse transferring networks. This makes it possible to set the control signals for all the network delays so the clock pulses arrive at all utilization devices within a predetermined tolerance of each other.

Those having normal skill in the art will recognize the foregoing and other objects, features, advantages and applications of the present invention from the following more detailed description of the preferred embodiments as illustrated in the accompanying drawings.

DETAILED DESCRIPTION OF THE PREFERRED EMBODIMENTS

Clock pulses operating in the hundreds of megaHertz range are typically employed as the master pulse source in conjunction with many computer configurations. These clock pulses control functions performed in data handling and processing elements contained within groupings. The clock pulses and their timing interrelationships are especially critical for clustered multiprocessor systems. The single common master clock locks the operating frequency of the various units and simplifies the functional coordination between elements or groups.

Figure 1:
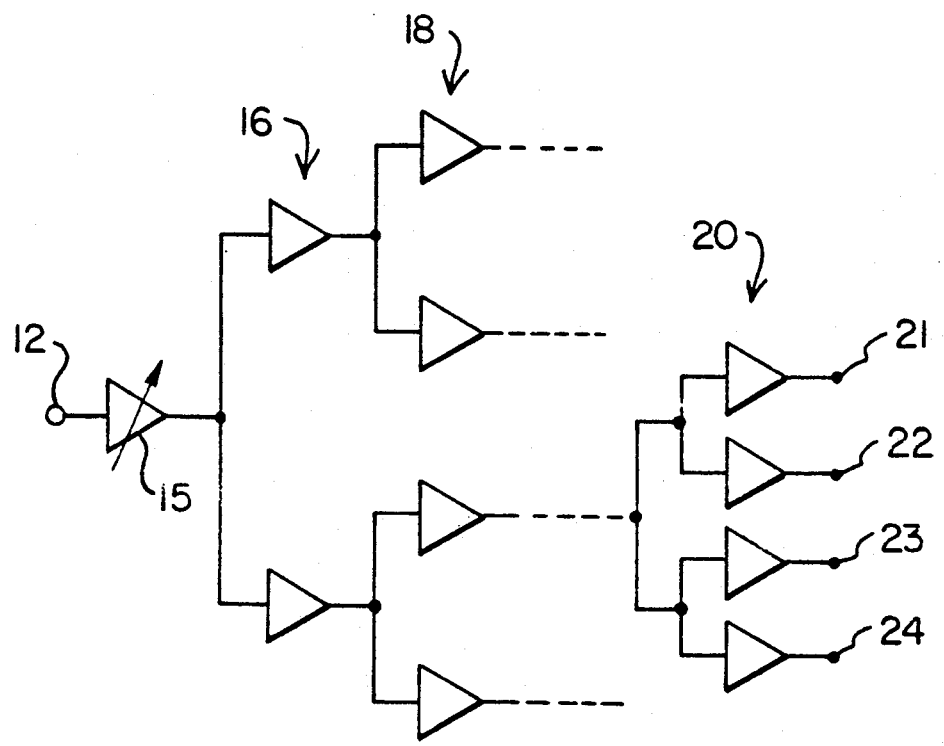
FIG. 1 is a schematic diagram of an integrated circuit powering tree.

FIG. 1 presents a schematic diagram of an integrated clock powering tree. Master clock 10 (note FIG. 2) produces pulses which are introduced to the tree at the terminal 12 input for a variable delay circuit 15. The pulses are split to provide multiple inputs to banks of amplifier elements such as 16, 18 and 20. Ultimately a string of output pulses are produced such as at terminals 21–24 to drive a basic integrated circuit element sometimes herein referred to as a "primitive" element.

The interconnect is modeled as an RC distributed network. It can be considered a lumped network. Therefore an H-tree or other appropriate connection methodology is useful to realize fan-out. Primitive elements exist throughout the clock distribution system. Skew between the N outputs is important at this level in the clock hierarchy. Even a perfectly designed integrated circuit (IC) will have skew induced by process gradients.

One of the most difficult test problems is measuring skew between outputs of a single integrated circuit. The size of the chip is dictated by the I/O count. The output risetimes are on the order of 200 ps (picoseconds) within the state of the art. Therefore high density test fixtures such as wafer probe cards with very high bandwidths are required.

Figure 2:
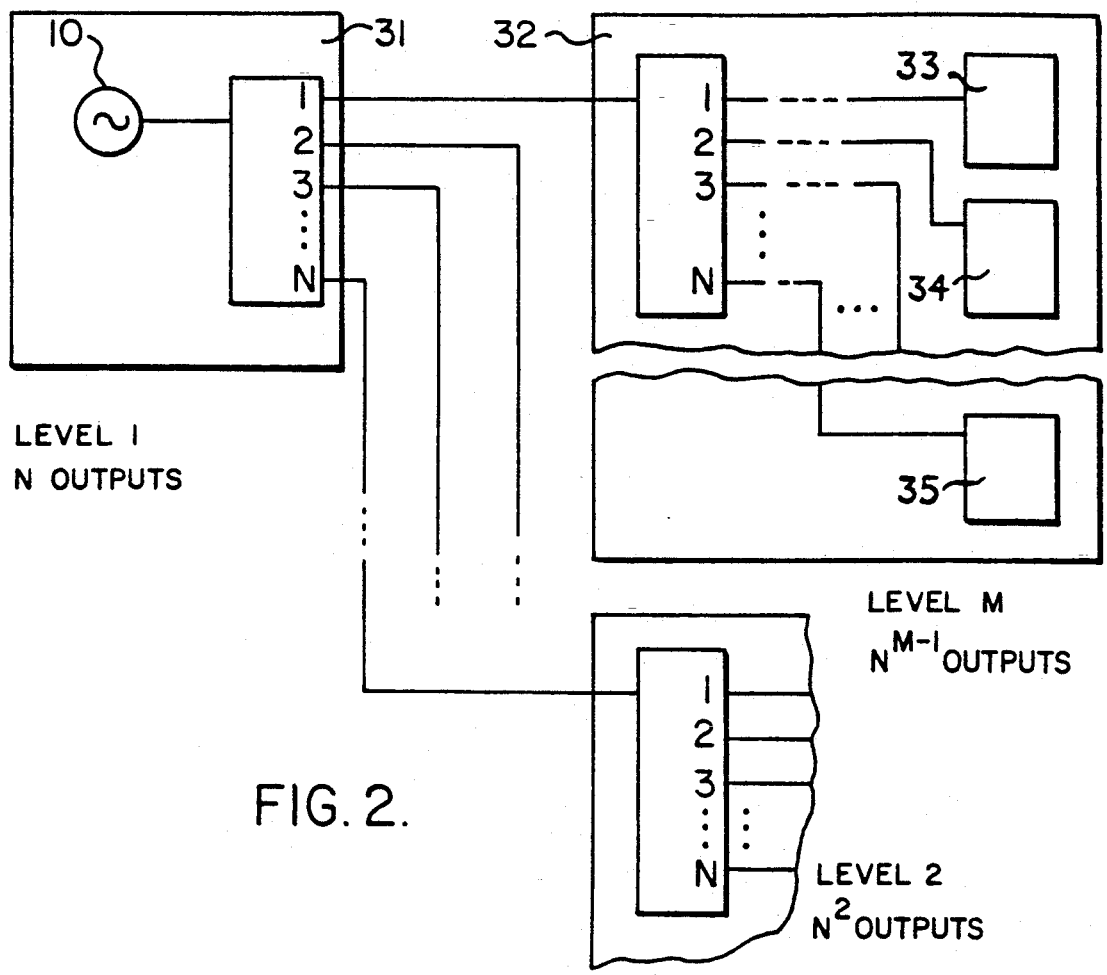
FIG. 2 is a block diagram of a system clock distribution configuration.

FIG. 2 depicts a typical system clock distribution in abbreviated block diagram form. Levels 1 through M-1 are implemented using the primitive element described earlier for the integrated circuit clock powering tree. Each block in each level could represent a single integrated circuit or a multiplicity of integrated circuits with a hierarchy of clock chips. Each block in level M such as 33, 34 and 35 is a logic chip. Each logic chip has a self contained fan-out that distributes clock signals to all latches.

The physical partitioning of levels is machine dependent. The configuration shown is only for illustrative purposes. Connections between printed circuit board (PCB) 31 and printed circuit board 32 are preferably backplane connections. Within PCB 32, micro-strip type connections are preferably employed. All of these connections are distributed transmission lines and proper terminations are required. In high speed clock applications, fan-out is usually limited to one to guarantee signal integrity.

There are two primary clock skew sources. One stems from the propagation delay differences between clock chips and between logic chips. The second is delay differences between connections. The between chip skew problem is partially solved by using a variable delay element at the input such as variable delay 15 in FIG. 1. Its purpose is to set all clock chip delays to the same value. This is a static adjustment and once made becomes final. Some of the problems the variable delay cannot overcome are test to system correlation problems (measurement), skew from drift and aging, and environmental fluctuations/gradients as from temperature, power supply, etc.

Preferably each clock chip in the system employs the present invention. Each logic chip can also use the present invention although possibly at the expense of system logic in competing for area in the chip.

Figure 3:
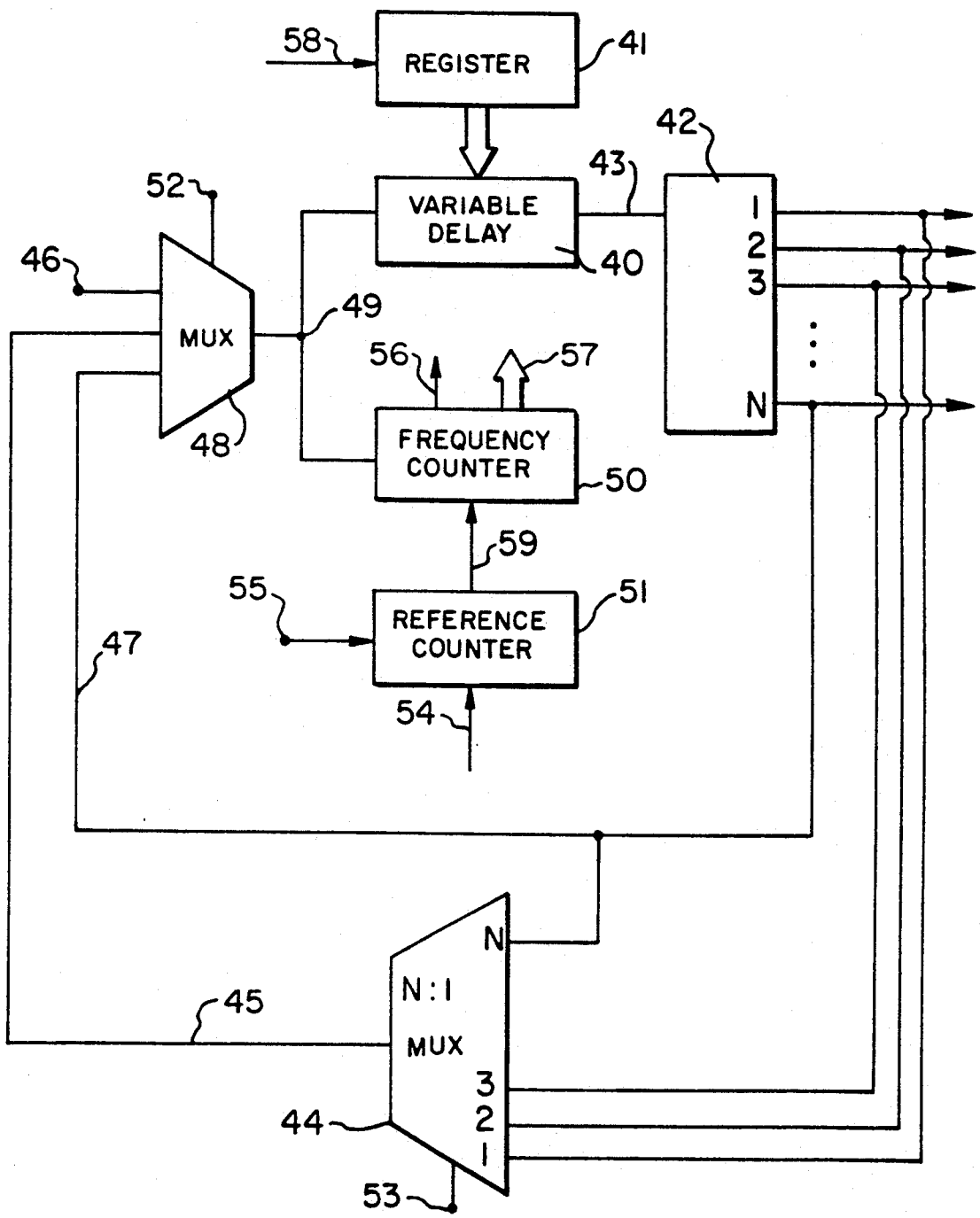
FIG. 3 is a block diagram of the circuitry for determining clock path frequency and controlling of the variable delay.

The present invention is described herein in conjunction with the exemplary preferred embodiment of FIG. 3 as built around the clock powering tree of FIG. 1. The variable delay element 40 is accessed by a scannable chain of latches contained in serial scan-in register memory 41. If desired, variable delay element 40 can incorporate serially connected coarse and fine delay segments. All N outputs of chip 42 are reduced through an N:1 multiplexer 44 with its output 45 combined at the input to 3:1 multiplexer 48 with the system clock at terminal 46 and the test mode input 47 which is herein referred to as the representative interconnect.

While any chip 42 output can provide the representative interconnect 47 signal, it is preferable to employ a common connection from all chips such as the "N" terminal so as to minimize differences of characteristics as between chips. With the connections appropriately completed, the system becomes a ring oscillator because an inversion is included in the path. The frequency of oscillation is thus directly correlated to the delay of the circuit chip under test. By varying the delay, the frequency will likewise vary. The MCU can set the various variable delays to increase or decrease the ring frequency to a common number for all chips. Note that the actual data byte employed for a given delay setting may differ from the byte for another chip even though the actual delay encountered by the system clock pulses is the same for both circuits.

A predetermined one of the N outputs of chip 42 is delayed through representative interconnect 47 at the test pin of multiplexer 48 and reintroduced to clock chip 42. Preferably the representative interconnect is a standard length link of known delay for inclusion in the feedback loop. When the test mode is selected for multiplexer 48, the loop formed by the positive feedback path will oscillate at a frequency that is directly correlatable to the propagation delay. By use of on-board frequency counter 50, the propagation delay is monitored and adjusted under system control.

Usual considerations for the frequency counter 50 design are that it should count down the system clock 46 to provide a stable count interval. The length of the clock interval is selected to give the required resolution. Inclusion of representative transmission line 47 as a connection in the feedback path also accounts for skew in the transmission lines between printed circuit boards.

Since the skew determination function is controlled by the operating system during regular maintenance and/or diagnostic intervals, it is possible to tune each clock chip. This allows realization of several advantages. For instance, it is possible to institute regular tune-ups to adjust for aging and drifting. No test-to-system correlation problems are involved as in burn-in. Tuning is performed in a system environment at a correct operating temperature with appropriate physical proximities. The frequency counter 50 allows for picosecond resolution and adjustment of skews. Frequency counters historically are the best tools for obtaining this type of resolution.

Another advantage is that the pin-to-pin skew for an individual die is statistically extracted when using the N:1 multiplexer 44 feedback path. Thus, if S1 is the skew of the system forward path and S2 is the skew of the N:1 feedback, then the total skew in measurement Sm is the square root of the sum of S1 squared and S2 squared. The pin-to-pin skew S if S, S1 and S2 are all approximately equal is Sm divided by the square root of two.

Inclusion of delay adjustment elements into each of the N outputs permits tuning of the pin-to-pin skew as well as the between-chip skew. A fine adjustment network is potentially adequate for this purpose. The entire operation is controlled by a master control unit (MCU) computer not shown in the drawings. However, the organization and . interconnections of such MCU's are readily apparent to those having normal skill in the art in the light of the present description. In FIG. 3, for instance, the particular input 45–47 into multiplexer 48 is selected as its output via control input 52 from the MCU. Copending U.S. patent application Ser. No. 07/536,270 entitled CLOCK DISTRIBUTION APPARATUS AND PROCESS PARTICULARLY USEFUL IN MULTIPROCESSOR SYSTEMS by Priest et al shows a system organization including MCU arrangements suitable for including the present invention.

Furthermore, the MCU actuates the N:1 multiplexer 44 via control input signals at 53 to select one of the pin outputs of chip 42. Reference counter 51 is controlled via the MCU input at 54 to commence counting system clock pulses introduced to 55. The frequency counter 50 indicates to the MCU that it is ready via line 56. At that time, the MCU generates the start signal at 54 thereby causing counter 51 to place a signal on line 59 to enable frequency counter 50 to start counting pulses present at output 49 of multiplexer (MUX) 48.

After reference counter 51 has counted a predetermined number of system clock pulses at 55, it directs counter 50 to stop counting node 49 pulses. The content of counter 50 is read to the MCU over cable 57 for interpretation and adjustment as necessary as is described below. The MCU likewise controls the amount of delay introduced to the input of chip 42 by variable delay 40 by means of input 58.

Figure 4:
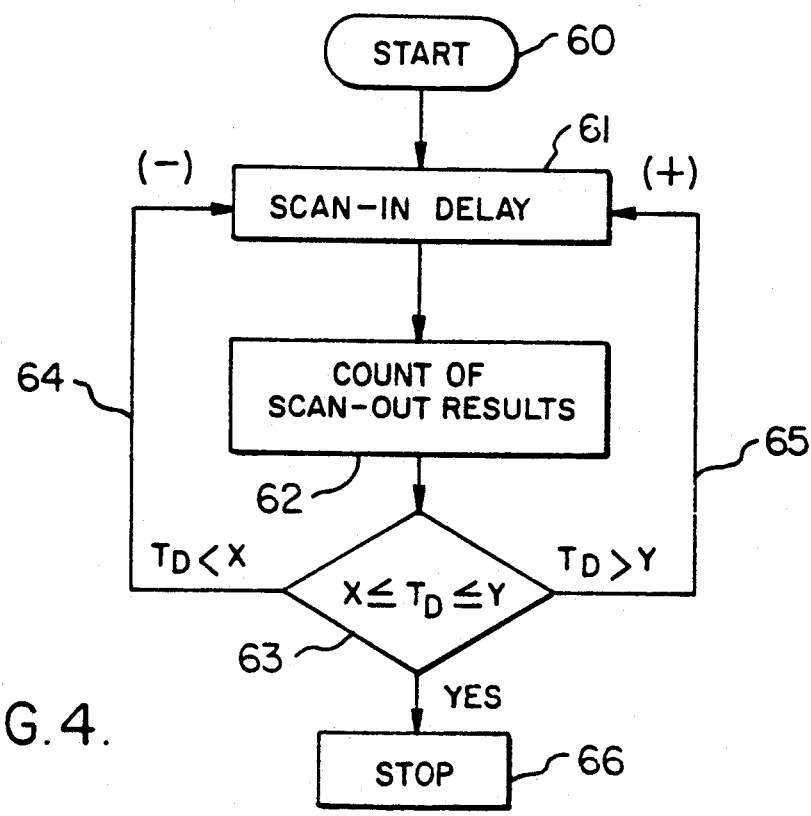
FIG. 4 is a logic flow diagram of the FIG. 3 circuit operation.

Operation of the MCU in association with the FIG. 3 circuitry is illustrated in the FIG. 4 logic flow diagram. Before the FIG. 4 functions are performed, the MCU has determined which chip 42 pin output N:1 multiplexer 53 is to select to establish the line 45 input to multiplexer 48. Of course it is possible to perform a standard test against a known feedback path via representative interconnect 47 or even perform a straight clock test if the MCU directs MUX 48 to select either input 47 or input 46, respectively. Note that FIG. 3 is shown with representative interconnect 47 connected to the "N" output although it is acceptable to connect 47 in series with any of chip 42 outputs.

Once the feedback network is established by the appropriate multiplexer selections by the MCU, the MCU prepares for the start 60 by selecting a particular byte of digital data comparable to a predetermined amount of delay. This byte is serially loaded into register 41 which in turn delivers the byte in parallel to the variable delay 40. This corresponds to the action block 61 in FIG. 4. As shown at 62, the MCU next receives the count of the scan-out results from counter 50 via parallel output 57. An indication at 64 that the count is too low results in a reduced (−) delay count introduction at 61 whereas an excessive count at 65 causes an increase (+) in the delay to reduce the closed loop frequency. Ultimately a decision is reached that the count Td is within the boundaries of the X and Y tolerances as is depicted by the affirmative output of decision block 63 in FIG. 4 thereby terminating the processing at 66.

The minimum tolerance X and maximum tolerance Y for an acceptable feedback circuit-count Td are determined in advance. Skew produced in the distribution and delivery of clock pulses has the effect of reducing the time productive logic is performable in a given cycle. Skew produced by primitive to primitive is adjusted to within the step resolution of the variable delay circuit 40.

The delay difference produced by the digital value "k" in register 41 and the digital value "k+1" in register 41 is considered the tolerance X. The frequency counter 50 must have enough resolution to tell when the variable delay counter 40 is set to digital value k or k+1. The count delta "td" corresponding to tolerance X is used to determine the upper and lower limits of an acceptable count. The target count "Tt" is arbitrarily set to correspond to setting the variable delay circuit 40 to the middle of its adjustment range.

If the count Td received from counter 50 is less than the minimum X (or Tt−td), decision 64 is reached wherein the magnitude of the delay set into register 41 is reduced thus increasing the count on the next test cycle. Conversely an excessive count wherein Td is greater than the maximum count Y (or Tt+td) produces decision 65 wherein the delay introduced to register 41 is increased thereby reducing the count at 57 from counter 50. Eventually the count Td falls within the range defined by X and Y (i.e.: between Tt−td and Tt+td) and the MCU reaches the stop decision 66. The MCU selects the most appropriate byte for loading register 41 with that byte stored by the MCU for further use in conforming the delays of chip 42 with the other system delays. Furthermore, the same count criteria is applied in all instances of the primitive in the system.

Thus the present invention makes it possible to employ a minimal number of additional elements to test an integrated circuit part and adjust it for skew in a manner that takes into account the realities of the environment including chip aging, the effects of temperature, etc. The skew is periodically measurable in the system operating environment and adjustable to compensate for that environment. Counter 51 establishes a time window for the measurement while counter 50 is started and stopped in accordance with that window.

Figure 6:
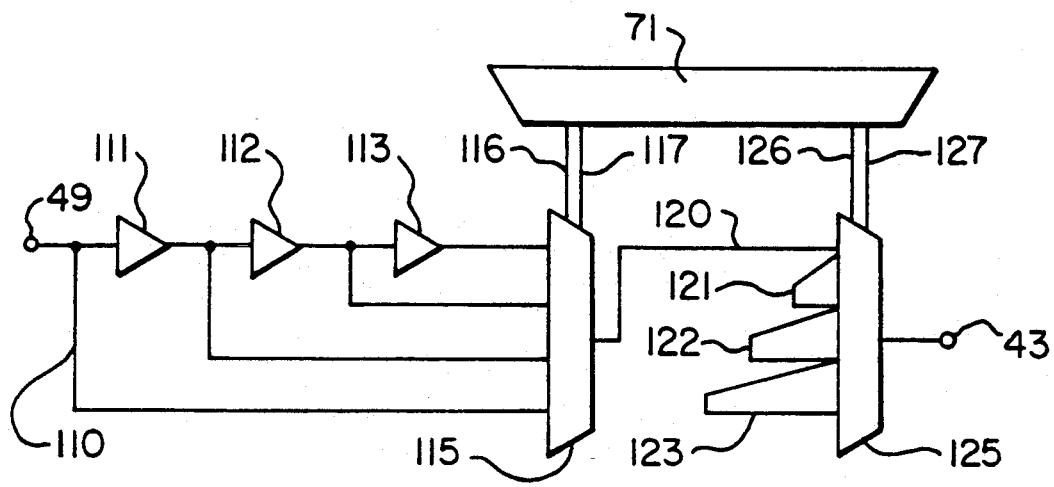
FIG. 6 is an example of a variable delay circuit useful in the FIG. 5 environment.
Figure 5:
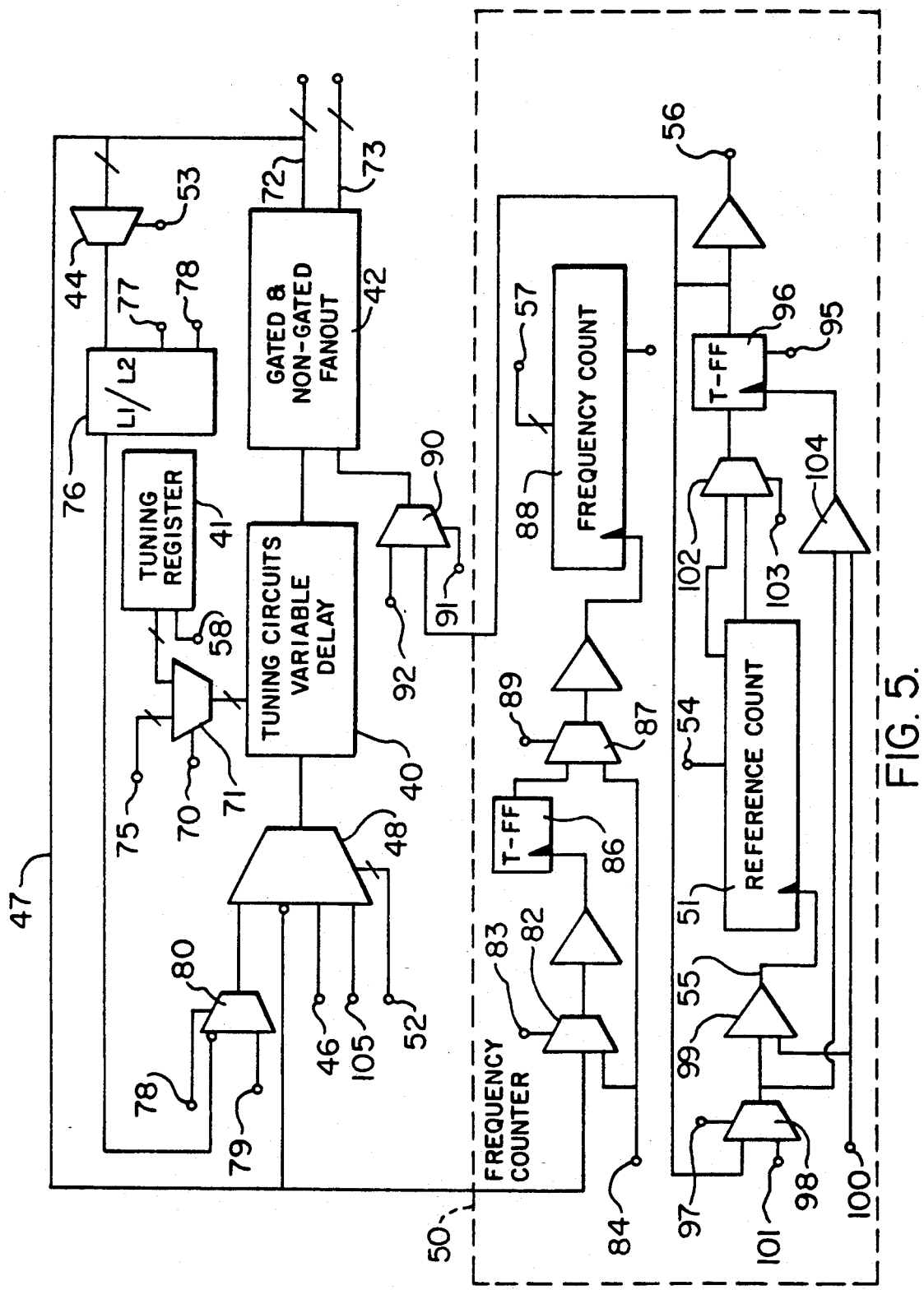
FIG. 5 is a somewhat expanded system block diagram of the elements associated with a FIG. 3 type of system.

The circuitry of FIG. 3 is shown in somewhat more expanded form in the diagram of FIG. 5. In normal system operation, a byte is scanned into tuning register 41 at input 58 under control of the MCU. The MCU places an enabling signal on terminal 70 to cause gate 71 to select the contents of register 41 for introduction to variable delay tuning circuit 40. Typically register 41 is serially loaded but produces its output for delay 40 in parallel. One example of a variable delay circuit useful for delay 40 is shown in FIG. 6 and described later.

The MCU input at terminal 52 causes multiplexer 48 to introduce system clock pulses at 46 into the delay 40 for functional operation as is well known. That is, appropriately delayed clock pulses are provided at the output of delay 40 for driving the gated and non-gated fanout clock powering tree 42. Network 42 therefor produces a plurality of gated clock pulses at multiple conductor output 72 while free or non-gated clock signals appear at output 73.

As a back-up or as an alternative, it is possible to introduce a fixed byte of data or a manually selected byte of data at terminal 75 for introduction to delay 40 via gate 71. Again the MCU controls this selection through input 70.

An on/off latch 76 is included in line with the multiple outputs from the N:1 multiplexer 44 to allow testing in conjunction with gate 80 which responds to an input selection signal at 78 from the MCU and a test clock signal at 79. A predetermined one of the multiple outputs 72 from fanout 42 is connected to establish the representative interconnect 47 into multiplexer 48. It likewise provides an input to test gate 82 under control of the MCU at 83.

A test enabling signal 84 in conjunction with the representative interconnect 47 pulse passes through gate 82 to ultimately actuate the bistable flip-flop circuit 86 which thereby establishes the first bit of the count for counter register 88 via gate 87 under control of test enabling signal 89. Counting is actually started and stopped by gate 90 in response to selection signal 91 by closing and opening the ring circuit network.

The MCU signals the counter to start by an enabling signal at input 95 to actuate the bistable flip-flop circuit 96. This causes gate 98 to respond to test signal 97 and clock input 101 to enable amplifier 99 to commence passing system clock signals 100 into the reference counter 51. Whenever a count equal to the predetermined sampling time period has passed, gate 102 is enabled to switch flip-flop 96. This causes interruption of the ringing circuit to cease counting of pulses therefrom in counter 88 and to produce an output signal at terminal 56 signifying to the MCU that the counting operation is completed. The MCU then scans out the content of counter 88 at output 57.

The counting window id defined by counter 51 which can employ a fixed count as suggested in the drawing. If desired, it is possible to include an arrangement to introduce a variable count to counter 51 thereby allowing the MCU to select the width of the scan window.

Selectable input 105 into the multiplexer 48 is any output that is derived from a chip and returned at terminal 105. It allows ringing circuit testing of individual chip clock pulses.

Again, in normal system operation, system clock pulses at input 46 drive delay 40 which applies an amount of delay to that clock pulse in correspondence to the MCU set value in register 41 or at input 75. These pulses are the input to the clock powering tree 42.

A variety of known techniques are available for implementing the variable delay 40. One example is illustrated in FIG. 6 wherein the output 49 of selection multiplexer 48 provides the input. A coarse tune delay section is formed by delay elements 111, 112 and 113 which are serially connected to input 49 as shown. An undelayed connection 110 and the outputs of each delay element 111-113 establish inputs into multiplexer 115. The binary signal on output lines 116 and 117 of multiplexer 71 selects one of the coarse delay inputs 110-113 for output 120.

A fine tune delay section is next formed by the inputs 120-123 for multiplexer 125. In the example of FIG. 6, the input 120 from coarse tune multiplexer 115 is connected to a series of propagation delay wire loops shown at 121, 122 and 123. Note that each of loops 121-123 could have input 120 coupled thereto so as to produce a sequenced series of increasing delays as suggested by the size of the loops in the drawing. Alternatively the loops could have substantially equal delay lengths but with the loops serially coupled.

Ultimately the digital signal present on output leads 126 and 127 of multiplexer 71 determines which of the fine tune delays are selected by multiplexer 125 to produce output 43. Output 43 is delayed by the sum of the delays in the coarse and fine tune sections although if both 110 and 120 are selected there is little or substantially no delay between input 49 and output 43. When the MCU determines to measure the delay associated with a given output from fanout 42 (or from an off-chip returned clock pulse series at input 105), the gates are set to establish a closed loop ringing circuit in which the components for which testing is desired are the major elements. The representative interconnect 47 with its predetermined standard delay is likewise selectable.

The MCU analyzes the ringing circuit count returned to it after each count sampling. If the MCU determines that the count is within tolerance, it stores that number for system usage thereafter. If the count is out of tolerance, the MCU shifts the count in the appropriate direction and takes another sample. This procedure is repeated until an in-tolerance result is produced. Of course it is acceptable to complete a series of test runs until the tolerance boundaries are identified. This would allow selection of the value for use in the tuning register 41 as a function of the test results from the entire hierarchy of clock circuits. The MCU then re-opens the ringing circuit to permit renewed system operation.

While the exemplary preferred embodiments of the present invention are described herein with particularity, those having normal skill in the art will recognize various changes, modifications, additions and applications other than those specifically mentioned herein without departing from the spirit of this invention.

What is claimed is:

1. Apparatus for determining the delay of a pulse delivering circuit for delivering clock pulses from a source to a device which utilizes the clock pulses comprising
    means selectively operable for establishing a closed loop circuit including the pulse delivering circuit;
    means for introducing at least one pulse into said established closed loop circuit such that said introduced pulse recirculates through said closed loop circuit; and
    means for determining the length of time for said introduced pulse to recirculate through said closed loop circuit.

2. Apparatus in accordance with claim 1 wherein said determining means includes means for establishing a sampling period of time; and
    means for counting the number of times said introduced pulse recycles within said closed loop for the duration of said sampling period of time.

3. Apparatus in accordance with claim 2 wherein said sampling period establishing means includes a counter for counting a predetermined number of system clock pulses and further includes means for enabling said closed loop pulse counting means to count the number of times said introduced pulse recycles in said closed loop for a time period corresponding to the time required for said predetermined number of system clock pulses to occur.

4. Apparatus in accordance with claim 3 which includes means for introducing a selectable amount of delay in the clock pulse delivering circuit; and
    means for selecting the delay of said delay introducing means in response to the closed loop count from said determining means.

5. Apparatus for periodically adjusting the amount of delay applied to system clock pulses by a pulse transferring circuit connecting the clock pulses from a source of clock pulses to a utilization device comprising
    variable delay means responsive to digital data for producing an output pulse subsequent to receipt of an input pulse with the delay therebetween corresponding to said digital data;

means selectively operable for coupling said variable delay means between the source of the system clock pulses and the pulse transferring circuit;

means selectively operable for deactivating said coupling means for decoupling said variable delay from the source of clock pulses and for establishing a closed loop ringing circuit including said variable delay means and said pulse transferring circuit;

means for introducing a pulse from said source into said closed loop ringing circuit such that said introduced pulse rings through said closed loop ringing circuit; and means for determining the number of times said introduced pulse rings within said closed loop ringing circuit over a predetermined sampling time period.

6. Apparatus in accordance with claim 5 wherein said coupling means is selectively operable for re-coupling the system clock pulse source upon completion of operation of said pulse number determining means, said apparatus further including means for setting the value of digital data controlling said variable delay means in accordance with the number of pulses counted by said determining means.

7. Apparatus in accordance with claim 6 wherein the apparatus includes a plurality of networks connecting the clock pulses from a common source to respective clock pulse utilization devices and wherein each said network includes a pulse transferring circuit, a said variable delay means, a said coupling means, and a said closed loop establishing means.

8. Apparatus in accordance with claim 7 which includes a computer means coupled to each of said networks for determining the delay of each said network and for establishing the digital data input to each said delay means of said networks for causing the clock pulses to arrive at the plurality of utilization devices within a predetermined time range of each other.

9. Apparatus in accordance with claim 8 wherein the pulse transferring circuit of each said network includes a clock pulse distribution tree for splitting a clock pulse for introduction into a plurality of output terminals connected to respective ones of a plurality of utilization devices and wherein said closed loop establishing means includes means for selecting a said output terminal for completing the closed loop.

10. Apparatus in accordance with claim 5 wherein the pulse transferring circuit includes a clock pulse distribution tree for splitting a clock pulse for introduction into a plurality of output terminals connected to respective ones of a plurality of utilization devices and wherein said closed loop establishing means includes means for selecting a said output terminal for completing the closed loop.

11. Apparatus in accordance with claim 5 wherein said determining means includes a first counter, means for introducing pulses of a known frequency to said first counter at the beginning of each said sampling period, means for indicating that a predetermined count is reached by said first counter for indicating the end of said sampling period, and means for detecting the number of pulses that occurred in said closed loop between the start and stopping of said first counter.

12. Apparatus in accordance with claim 11 wherein said detecting means includes a second counter which stores the count of the number of times said introduced pulse recycles in said closed loop ringing circuit during counting operations of said first counter over the said predetermined sampling time period.

13. Apparatus in accordance with claim 5 wherein said variable delay means includes a register selectively loaded with said digital data and means responsive to said register content for producing an output pulse subsequent to receipt of an input pulse with the delay therebetween corresponding to the contents of said register.

14. The method of determining the delay of a pulse delivering circuit for delivering clock pulses from a source to a clock pulse utilizing device comprising the steps of establishing a closed loop circuit including the clock pulse delivering circuit in isolation from the clock pulses;

introducing a clock pulse from the source into said closed loop circuit such that said introduced clock pulse rings through said closed loop circuit; and determining the length of time for said ringing pulse to recirculate through said closed loop circuit.

15. The method in accordance with claim 14 wherein said determining step includes the step of selecting a sampling period of time; and counting the recurrence of recirculations of said introduced pulse within said closed loop for the duration of said sampling period of time.

16. The method in accordance with claim 15 wherein said sampling period selecting step includes the step of counting a predetermined number of system clock pulses and further includes the step of performing said closed loop pulse recirculation counting step to count closed loop recirculation pulses for a time period corresponding to the time required for said predetermined number of system clock pulses to occur.

17. The method in accordance with claim 16 which includes the step of introducing a selectable amount of delay in the clock pulse delivering circuit; and selecting the amount of delay for use in said delay introducing step in response to the closed loop count from said counting step.

18. The method of determining the delay of each of a plurality of circuit networks wherein said networks deliver clock pulses from a common source to a respective one of a plurality of clock pulse utilizing devices through a delay circuit capable of producing a signal at the output thereof delayed relative to the time of arrival of the signal at the input thereof by an amount corresponding to the magnitude of a control signal introduced thereto comprising the steps of establishing a closed loop ringing circuit including the clock pulse delivering network in isolation from the clock pulses for each such network;

introducing a pulse from said common source into each of said closed loop ringing circuits such that said introduced pulse rings through each of said closed loop ringing circuits;

determining the number of ringing pulses to recirculate within said closed loop circuit of each network over a predetermined period of time.

19. The method in accordance with claim 18 wherein said determining step includes the step of selecting a sampling period of time; and counting the recurrence of said introduced pulse recirculations within said closed loop for the duration of said sampling period of time.

20. The method in accordance with claim 19 wherein said sampling period selecting step includes the step of counting a predetermined number of system clock pulses and further includes the step of performing said closed loop pulse counting step to count closed loop pulse recirculations for a time period corresponding to the time period required for said predetermined number of system clock pulses to occur.

21. The method in accordance with claim 20 which includes the step of introducing a selectable amount of delay in each clock pulse delivering network; and selecting the amount of delay for use in said delay introducing step in response to the closed loop count from said counting step.

22. The method in accordance with claim 21 which includes the steps of determining the average delay of all the networks; and setting the control signals for the network delays for causing the clock pulses to arrive at all utilization devices within a predetermined tolerance of each other.

23. The method in accordance with claim 22 wherein each network divides the clock pulses received at the input thereof into a plurality of output terminals for use by respective utilization devices and including the step of selecting one of said output terminals for establishing said closed loop ringing circuit.

* * * * *